(12) United States Patent
Kamikubo et al.

(10) Patent No.: US 8,222,144 B2
(45) Date of Patent: Jul. 17, 2012

(54) METHOD FOR MANUFACTURING SEMICONDUCTOR DEVICE, AND POLISHING APPARATUS

(75) Inventors: Noritaka Kamikubo, Osaka (JP); Hiroshi Yamauchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/462,249

(22) Filed: Jul. 30, 2009

(65) Prior Publication Data

US 2010/0035438 A1    Feb. 11, 2010

(30) Foreign Application Priority Data

Aug. 8, 2008  (JP) ................................ 2008-205190

(51) Int. Cl.
*H01L 21/302*    (2006.01)
*H01L 21/461*    (2006.01)
(52) U.S. Cl. ................... 438/692; 257/E21.23; 257/692
(58) Field of Classification Search .................. 257/692, 257/E21.23, E21.304, E21.579; 438/892
See application file for complete search history.

(56) References Cited

U.S. PATENT DOCUMENTS

| 2002/0195424 A1* | 12/2002 | Tanaka | 216/84 |
| 2005/0153560 A1* | 7/2005 | Enomoto | 438/692 |
| 2006/0138086 A1 | 6/2006 | Lane et al. | |
| 2006/0213126 A1 | 9/2006 | Cho et al. | |
| 2008/0014751 A1* | 1/2008 | Tanaka et al. | 438/693 |

FOREIGN PATENT DOCUMENTS

| CN | 1822325 A | 8/2006 |
| JP | 2001-310256 | 11/2001 |
| JP | 2006-279050 A | 10/2006 |

* cited by examiner

*Primary Examiner* — Tony Tran
(74) *Attorney, Agent, or Firm* — Edwards Wildman Palmer LLP; David G. Conlin; Edmund Koundakjian (57) ABSTRACT

An interlayer insulating film is formed on a semiconductor substrate having a semiconductor element formed thereon. At this time, there are protrusions higher than surroundings thereof and non-protruding portions lower than the protrusions on the surface of the interlayer insulating film. First, a first polishing process is carried out on the surface of the interlayer insulating film with use of a first abrasive having non-Prestonian properties produced by mixing abrasive materials including abrasive grains, a polymer additive and water at a predetermined first mixture ratio. Then, after the first abrasive process shifts to an automatically stopping state, a second polishing process is carried out on the surface of the interlayer insulating film with use of a second abrasive having the concentration of polymer additive lower than that of the first abrasive and produced by mixing the abrasive materials at a second mixture ratio different from the first mixture ratio.

7 Claims, 5 Drawing Sheets

METHOD FOR MANUFACTURING SEMICONDUCTOR DEVICE, AND POLISHING APPARATUS

CROSS REFERENCE TO RELATED APPLICATION

This Nonprovisional application claims priority under 35 U.S.C. §119(a) on Patent Application No. 2008-205190 filed in Japan on 8 Aug. 2008 the entire contents of which are hereby incorporated by reference.

BACKGROUND OF THE INVENTION

1. Field of the Invention

The present invention relates to a method for manufacturing a semiconductor device, and in particular, to a method for flattening a surface after film formation. The present invention also relates to a polishing apparatus for such flattening.

2. Description of the Related Art

As semiconductor integrated circuits become more and more integrated, flattening technology for uniformly flattening a surface of a substrate in order to form microscopic patterns with high precision are becoming more important during the manufacturing process. As one of such conventional flattening technologies, there is widely used a CMP (chemical mechanical polishing) method in which a substrate is pressed against a polishing cloth (pad) for polishing with use of an abrasive liquid (slurry).

In cases where particularly high flatness is required at the time of flattening in accordance with the CMP method, namely, in such cases where an extra portion of an insulating film with which a trench is filled in is removed by polishing, the trench being created in an STI (shallow trench isolation) method upon forming an element isolation region in accordance with the STI method, a slurry having abrasive grains of ceric oxide (also referred to as "ceria") is widely used, as described in Japanese Unexamined Patent Publication No. 2001-310256.

This is because a higher polishing rate for silicon oxide films and a higher polishing rate selectivity for silicon nitride films used as a polishing stopper film can be obtained upon using a slurry having abrasive grains of ceric oxide and an appropriate organic compound as an additive, in comparison with cases of using a slurry having abrasive grains of silicon oxide (silica), which is conventionally and generally used. Further, ceric oxide has so-called non-Prestonian properties, so that the polishing rate decreases in the case where the polishing pressure is below a certain value. Therefore, it is possible to prevent the silicon oxide film from being polished excessively in the element isolation region at a stage where the polishing stopper film is exposed. As a result, achieved is polishing for high flatness with little dependency on the pattern.

Furthermore, as shown in Japanese Unexamined Patent Publication No. 2006-279050, abrasive materials having high non-Prestonian properties have been proposed in recent years, having a polishing rate with the polishing pressure (pressure for pressing an abrasive material upon polishing) being below a certain value is approximately 20 nm to 50 nm/min. In the case where the surface of a film having protrusions is polished with use of such an abrasive material, polishing has been performed at a polishing rate of approximately 100 nm to 1000 nm/min with existence of protrusions, while the polishing rate suddenly lowers to approximately 50 nm/min or less at a stage where there are no longer protrusions and the surface of the polished film is approximately flat, and thus, polishing barely progresses in comparison with normal polishing rates.

In other words, even in cases where there are no polishing stopper films made of a material different from that for the film to be polished, as in an interlayer insulating film having protrusions formed after semiconductor elements or metal wires are formed, the polishing rate automatically and suddenly lowers (polishing hardly progresses, this state is referred to as "automatically stopping state" hereinafter) at the stage where the protrusions are removed, with use of abrasive grains (abrasive material) having high non-Prestonian properties as described above. Thus, a polishing process can be carried out on such an interlayer film for high-level flatness.

In the case where a flattening process (polishing process) is carried out on a film to be polished having protrusions with use of abrasive grains having high non-Prestonian properties as described above, polishing automatically slows down when the protrusions are removed and the surface of the polished film is substantially flat. Therefore, even when there are defects such as scratches on the surface of the polished film, they are not removed and remain as they are, and thus, there arises a problem that the density of defects on the surface of the polished film is very high even after the flattening process. In addition, the polishing rate is very low after protrusions are removed, and therefore, there arises a problem that it is difficult to control the amount of polishing in the CMP process for each lot to be processed in accordance with the amount of film formed as measured in advance of the CMP process.

SUMMARY OF THE INVENTION

In view of the above described problems, an object of the present invention is to provide a flattening method for preventing defects on the surface of the polished film and for controlling the thickness of the polished film when the surface of the formed film to be polished is flattened with use of abrasive grains made of a material having high non-Prestonian properties, as well as to provide a method for manufacturing a semiconductor device with use of this flattening method.

In order to achieve the above described object, a method for manufacturing a semiconductor device according to the present invention is a method for manufacturing a semiconductor device comprising: forming a film to be polished made of an insulating film or a conductive film on a semiconductor substrate; and flattening a surface of the film after the forming step, wherein the flattening step comprises a first polishing process carried out on the surface of the film using a first abrasive with non-Prestonian properties produced by mixing abrasive materials, including abrasive grains, a polymer additive and water, at a predetermined first mixture ratio, and a second polishing process carried out on the surface of the film using a second abrasive produced by mixing the abrasive materials at a predetermined second mixture ratio different from the first mixture ratio to make a concentration of the polymer additive lower than that of the first abrasive, wherein the second polishing process is carried out after the first polishing process shifts to an automatically stopping state in which polishing hardly progresses.

The non-Prestonian properties in the first polishing process are obtained as a result of the polymer additive, and thus, the level of the non-Prestonian properties can be changed by adjusting the composition ratio, using the same components. Accordingly, an abrasive having a concentration of polymer additive lower than the first abrasive is used as the second abrasive, so that the conditions are set so that there are no non-Prestonian properties, and as a result, it is possible to make the automatically stopping state more difficult to happen in comparison with the first polishing process.

More specifically, in accordance with the features of the method for manufacturing a semiconductor device according to the present invention, in the first polishing process using an abrasive of which the concentration of polymer additive is relatively high, the uneven surface of a film is flattened, and in a second polishing process using an abrasive of which the concentration of polymer additive is relatively low, a region of the surface of the film having defects after the first polishing process is polished, so that the number of defects can be reduced on the surface after polishing. As a result, a flattening process can be carried out on the surface of the film without excessively polishing the film, and at the same time, the number of defects in the film can be greatly reduced after polishing in comparison with in the prior art.

Furthermore, in the second polishing process carried out after the first polishing process, the polishing rate is high in comparison with in the first polishing process, and therefore, polishing can be carried out at a rate that can be monitored on the surface of the film in a surface state where flattening proceeds to some extent, specifically, where there is no unevenness having difference in height of 100 nm or more (hereinafter, referred to as a "first surface state"). As a result, it becomes possible to control the second polishing process so that it finishes at the point in time when the film is polished by a predetermined thickness, and thus, it is easy to adjust how much of the film remains.

In addition to the above features, the method for manufacturing a semiconductor device according to the present invention may be further configured such that the second polishing process comprises removing a surface of the film by a thickness of a region including at least part of defects generated in the film in the first polishing process.

In addition to the above features, the method for manufacturing a semiconductor device according to the present invention may be further configured such that the second abrasive is produced so as to have the concentration of the polymer additive equal to or lower than ¼ of that of the first abrasive.

In this configuration, an uneven surface is flattened in the first polishing process, and the polishing rate greatly decreases at a stage where the surface of the film becomes of a first surface state, and therefore, the timing of completion of the first polishing process is completed is easy to recognize. In addition, the polishing rate on the surface of the film that has become of a first surface state is sufficiently slow, and therefore, the film is not excessively polished after the completion of the flattening process on the uneven surface.

In addition to the above features, the method for manufacturing a semiconductor device according to the present invention may be further configured such that the first polishing process is carried out using the first abrasive obtained by mixing the supplied abrasive materials at the first mixture ratio controlled by a polishing apparatus, and the second polishing process is carried out using the second abrasive obtained by mixing the supplied abrasive materials at the second mixture ratio controlled by the polishing apparatus.

In this configuration, the first polishing process and the second polishing process can be carried out in the same polishing apparatus, by adjusting only the mixture ratio of the abrasive material. As a result, the polishing apparatus can be simplified.

In addition to the above features, the method for manufacturing a semiconductor device according to the present invention may be further configured such that the first polishing process is carried out under a predetermined first polishing pressure and the second polishing process is carried out under a second polishing pressure higher than the first polishing pressure.

In this configuration, the uneven surface of the film is flattened in the first polishing process, where the polishing pressure is relatively low, and the region having defects on the surface of the film after the first polishing process is polished in the second polishing process, where the polishing pressure is relatively high, and thus, the number of defects can be reduced on the surface after polishing. As a result, a flattening process can be carried out on the surface of the film without excessively polishing the film, and at the same time, the number of defects in the film can be greatly reduced after polishing in comparison with in the prior art. At this time, the polishing pressure in the second polishing process carried out after the first polishing process is higher than that in the first polishing process, and therefore, the surface of the film in the first surface state can be polished at a rate that can be monitored. As a result, it is possible to control the second polishing process so that it is completed at the point in time when the film is polished by a predetermined thickness, and thus, it is easy to adjust how much of the film remains.

In addition to the above features, the method for manufacturing a semiconductor device according to the present invention may be further configured such that the second polishing process is carried out on the surface of the film in a surface state which causes the first polishing process to shift to the automatically stopping state at a polishing rate equal to or more than 200 nm per minute.

In this configuration, the region of the film including defects on the surface of the film after the first polishing process can be polished while reducing the number of defects which remain after polishing in comparison with in the first polishing process. In addition, the surface of the film in the first surface state can be polished at a polishing rate that can be monitored, and therefore, control of the film thickness as a result of polishing can be facilitated. As a result, the second polishing process is controlled so that it is completed after polishing only the region of the film including many defects after the first polishing process, so that the number of defects remaining in the film after polishing can be reduced without excessively polishing the film.

In this configuration, the polishing rate on the surface of the film in the first surface state is sufficiently slow, and therefore, the film is not polished excessively after the completion of the flattening process on the uneven surface. As a result, the first polishing process shifts to the second polishing process without excessive polishing.

In addition to the above features, the method for manufacturing a semiconductor device according to the present invention may be further configured such that the second polishing process is completed when the film is polished by a thickness equal to or more than 30 nm.

In this configuration, the number of defects which remain in the film after the second polishing process can be reduced, so that there aren't any problems in the subsequent manufacturing process.

In addition to the above features, the method for manufacturing a semiconductor device according to the present invention may be further configured such that the film is a silicon oxide film formed in accordance with an HDP method.

In this configuration, the polishing rate on the film in the first surface state is sufficiently slow in the first polishing process, and thus, the film can be prevented from being excessively polished.

Furthermore, the polishing apparatus according to the present invention comprising a first polishing process unit configured to carry out a polishing process on a surface of a film to be polished using a first abrasive having non-Prestonian properties produced by mixing abrasive materials including abrasive grains, a polymer additive and water at a predetermined first mixture ratio; a second polishing process unit configured to carry out a polishing process on the surface of the film using a second abrasive produced by mixing abrasive materials at a second mixture ratio different from the first mixture ratio to make a concentration of the polymer additive lower than that of the first abrasive; and a polishing state detecting unit configured to detect a polishing state of the film, wherein the polishing state detecting unit detects that the polishing process on the film has shifted to an automatically stopping state in the first polishing process unit, and then gives an instruction to the second polishing process unit to carry out the polishing process on the film.

The polishing apparatus according to the present invention has such a configuration that the uneven surface of a film can first be flattened in the first polishing process using the first abrasive material in which the concentration of the polymer additive is relatively high in the first polishing process unit, and after that the region of the surface of the film where there are defects after the first polishing process can be polished in the second polishing process using the second abrasive material in which the concentration of the polymer additive is relatively low in the second polishing process unit, and therefore, the number of defects on the surface after polishing can be reduced. As a result, a flattening process can be carried out on the surface of the film without excessively polishing the film, and at the same time, the number of defects in the film after polishing can be greatly reduced in comparison with in the prior art.

Furthermore, in the second polishing process carried out after the first polishing process, the polishing rate is high in comparison with in the first polishing process, and therefore, the polishing state detecting unit can carry out polishing on the surface of the film in the first surface state at a rate that can be monitored. As a result, it becomes possible to control the second polishing process so that it is completed at the point in time when the film is polished by a predetermined thickness, and thus, it is easy to adjust how much of the film remains.

In addition to the above features, the polishing apparatus according to the present invention also be further configured by comprising: a mixture ratio adjusting unit configured to be supplied with the abrasive materials and adjust a mixture ratio of the abrasive materials; and an abrasive supply port configured to supply an abrasive produced by mixing the abrasive materials at the mixture ratio adjusted by the mixture ratio adjusting unit, wherein the polishing state detecting unit detects that the polishing process on the film has shifted to the automatically stopping state in the first polishing process unit, and then gives an instruction to the mixture ratio adjusting unit to change the mixture ratio from the first mixture ratio to the second mixture ratio, and the abrasive supply port supplies the first polishing process unit with the first abrasive produced by mixing the abrasive materials at the first mixture ratio set by the mixture ratio adjusting unit, and supplies the second polishing process unit with the second abrasive produced by mixing the abrasive materials at the second mixture ratio set by the mixture ratio adjusting unit.

Further, the polishing apparatus according to the present invention comprises: a polishing cloth on which a wafer having a film to be polished is placed; a mixture ratio adjusting unit configured to be supplied with abrasive materials including abrasive grains, a high polymer additive and water, and adjust a mixture ratio of the abrasive materials; an abrasive supply port configured to supply the polishing cloth with an abrasive produced by mixing the abrasive materials at the mixture ratio adjusted by the mixture ratio adjusting unit; and a polishing state detecting unit configured to detect a polishing state of the film, wherein the polishing state detecting unit detects that a polishing process on the film has shifted to an automatically stopping state, the polishing process being carried out on the film in a condition where a first abrasive produced at a first mixture ratio set by the mixture ratio adjusting unit is supplied to the polishing cloth, and then the polishing state detecting unit gives an instruction to the mixture ratio adjusting unit to change the mixture ratio from the first mixture ratio to the second mixture ratio so that the polishing cloth is supplied with a second abrasive having a concentration of polymer additive lower than that of the first abrasive.

In the polishing apparatus according to the present invention, when the polishing state detecting unit detects that the polishing process using the first abrasive has shifted to an automatically stopping state, it gives an instruction to the mixture ratio adjusting unit to change the mixture ratio from the first mixture ratio to the second mixture ratio so that the polishing process can automatically shift to a polishing process using the second abrasive, in which the concentration of polymer additive is lower. As a result, the uneven surface of the film can be flattened in the polishing process using the first abrasive, in which the concentration of polymer additive is relatively high, and after that, the region of the surface of the film where there are defects after the first polishing process can be polished in the polishing process using the second abrasive, in which the concentration of polymer additive is relatively low, and therefore, the number of defects on the surface after polishing can be reduced. As a result, a flattening process can be carried out on the surface of the film without excessively polishing the film, and at the same time, the number of defects in the film after polishing can be greatly reduced in comparison with in the prior art.

In the configuration of the present invention, the number of defects on the surface of the film after flattening can be reduced, and at the same time, the control of the thickness of the remaining film after flattening can be facilitated.

DETAILED DESCRIPTION OF THE INVENTION

In the following, methods for manufacturing a semiconductor device, and the polishing apparatuses, according to respective embodiments of the present invention, are described with reference to the drawings.

First Embodiment

The first embodiment of the present invention (hereinafter referred to as "the present embodiment") is described with reference to FIGS. 1A to 4B.

FIGS. 1A to 1D are schematic cross sectional diagrams showing different steps in the method for manufacturing a semiconductor device according to the present embodiment. In addition, FIG. 2 is a flow chart showing the manufacturing steps in the method for manufacturing a semiconductor device according to the present embodiment, and the steps described below are the respective steps in the flow chart in FIG. 2. Here, the cross sectional diagrams in FIGS. 1A to 1D schematically show the steps, and the dimensions of the actual structure and the dimensions in the drawings do not necessarily match.

Figure 1A:
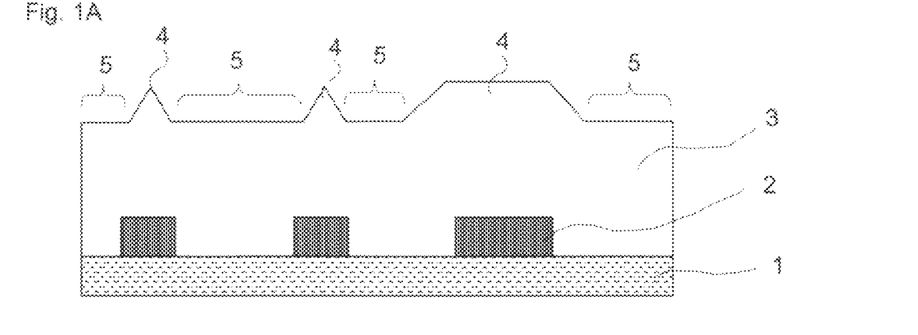
FIGS. 1A to 1D are cross sectional diagrams showing the manufacturing steps in the method for manufacturing a semiconductor device according to the present invention.
Figure 2:
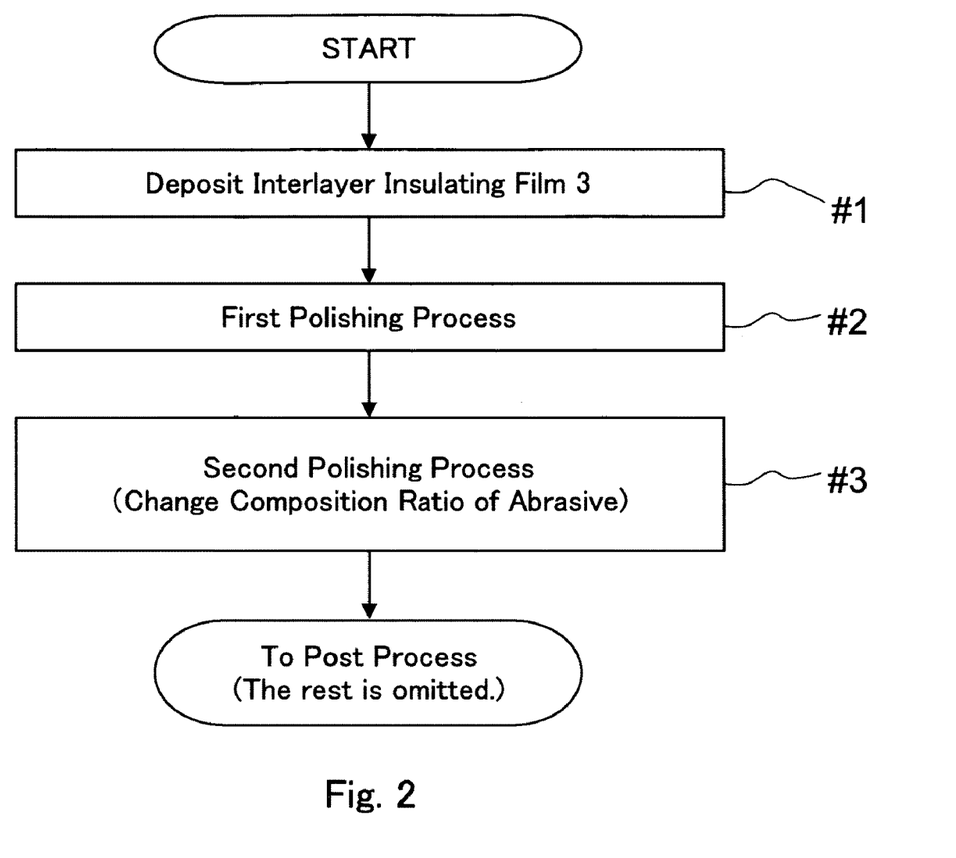
FIG. 2 is a flow chart showing the manufacturing steps in the method for manufacturing a semiconductor device according to the first embodiment of the present invention.

First, as shown in FIG. 1A, a semiconductor element or a metal wire layer (hereinafter simply referred to as "semiconductor element 2") is formed on a semiconductor substrate 1, and an interlayer insulating film 3 is deposited on top (step #1). A plasma silicon oxide film (P—SiO film) is deposited to a film thickness of approximately 100 nm to 2000 nm in accordance with an HDP (high-density plasma) method at a temperature for film formation of approximately 200° C. to 700° C. and under pressure of approximately 0.01 Pa to 10 Pa as the interlayer insulating film 3. Here, the thickness of the deposited interlayer insulating film 3 is at least greater than the height of the above described semiconductor element 2.

As shown in FIG. 1A, the surface becomes uneven due to the difference in level between the top of the regions where the semiconductor element 2 is formed and the top of the other regions when the interlayer insulating film 3 is deposited in step #1. In the following, the unevenness is referred to as "protrusions 4" or "non-protruding portions 5." Here, the unevenness is a region on the surface of the interlayer insulating film having a difference in level of approximately 100 nm or more in a direction perpendicular to the surface of the semiconductor substrate 1. That is to say, the top of the protrusions 4 is higher than the top of the adjacent non-protruding portions 5 by approximately 100 nm or more.

Figure 1B:
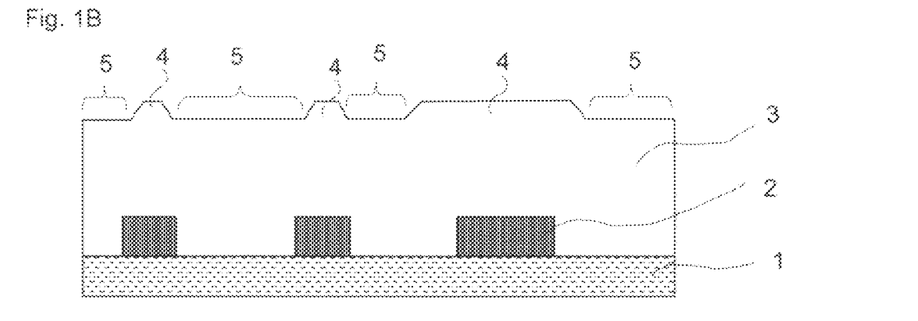
Figure 1C:
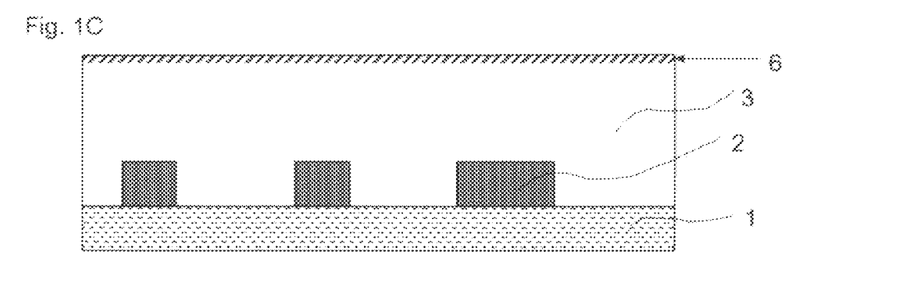
Figure 1D:
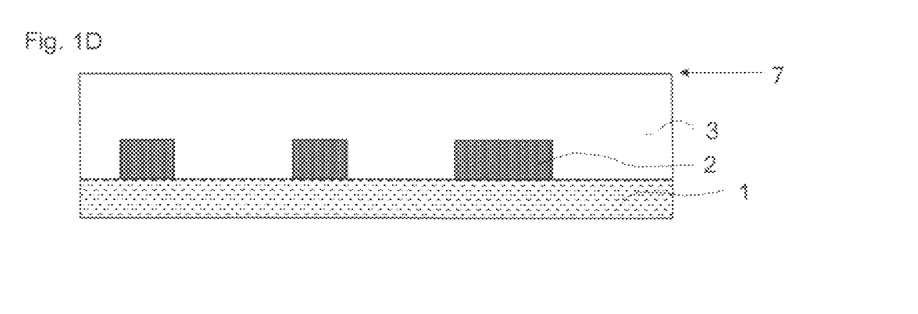

Next, as shown in FIGS. 1B and 1C, a polishing process using abrasive grains of an abrasive including ceric oxide (hereinafter referred to as "first polishing process") is carried out on the surface of the substrate in accordance with a CMP method (step #2). As a result, protrusions 4 formed on the upper surface of the interlayer insulating film 3 are removed. Here, FIG. 1B is a cross sectional diagram showing a state where the first polishing process is being carried out, and FIG. 1C is a cross sectional diagram showing the state when the first polishing process is completed. As shown in FIG. 1C, the surface of the interlayer insulating film 3 is in such a state that there are no protrusions 4 (hereinafter referred to as "first surface state") at the point in time when the first polishing process is completed.

In the step #2 in the first polishing process, a polishing process is carried out under such conditions that the polishing rate for the protrusions 4 is as high as in general CMP methods using an abrasive including abrasive grains of ceric oxide and when the surface of the interlayer insulating film 3 becomes the first surface state, the polishing rate automatically lowers and the polishing process shifts to the automatically stopping state (state in FIG. 1C). An abrasive produced by mixing abrasive materials, including abrasive grain (for example of ceric oxide), a polymer additive (for example an acrylic acid derivative polymer) and water, at a predetermined mixture ratio (for example abrasive grains:polymer additive is 1:2.5, hereinafter referred to as "first mixture ratio") is used as the abrasive (hereinafter referred to as "first abrasive").

Figure 3:
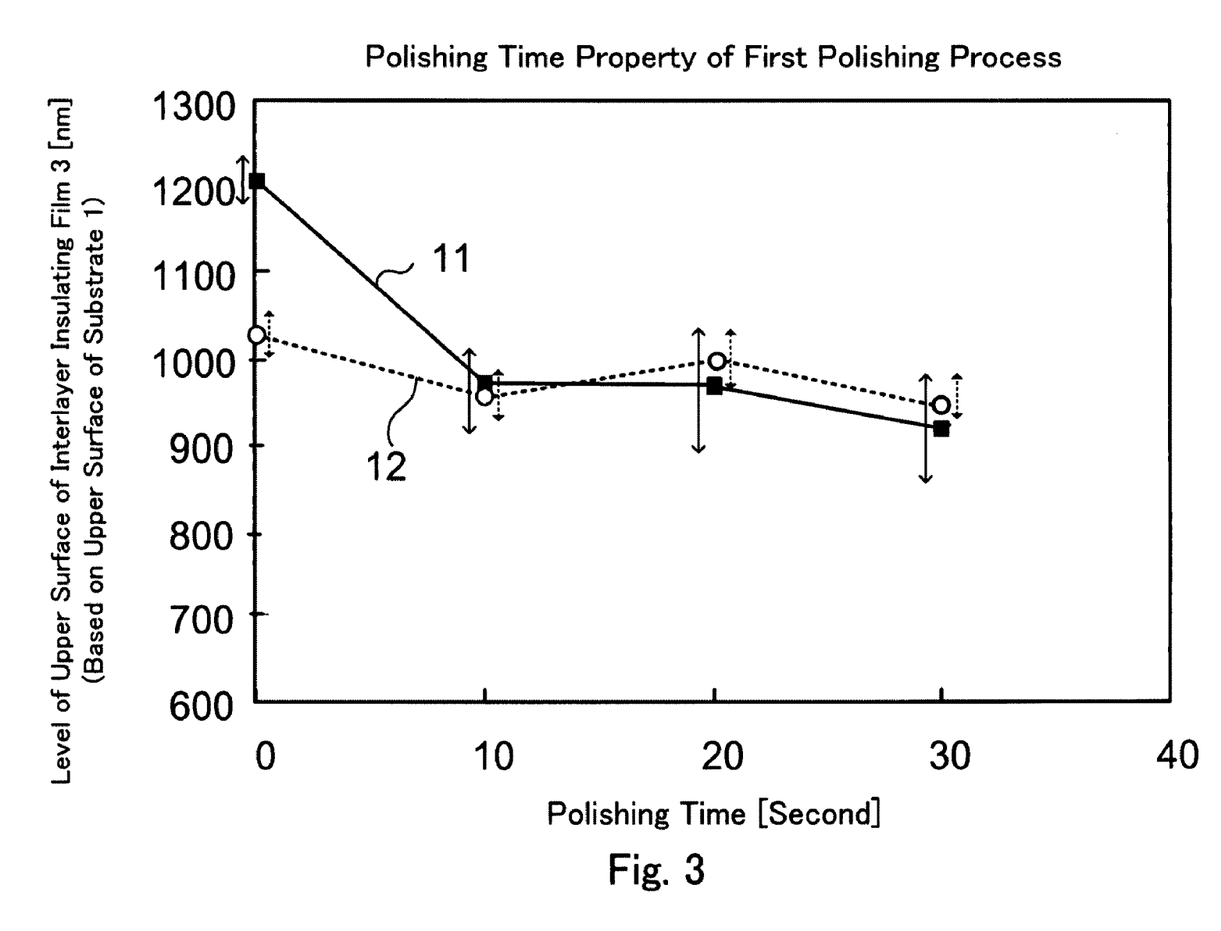
FIG. 3 is a graph showing the polishing time properties of the first polishing process.

As for the concrete conditions for polishing in the present step #1, approximately 200 ml/min of an abrasive CES-333-2.0 including ceric oxide abrasive grains made by Asahi Glass Co., Ltd. is supplied, the pressure for pressing the abrasive against the substrate at the time of polishing (hereinafter simply referred to as "polishing pressure") is approximately 3 psi (pounds per square inch; approximately 21 kPa), the rotational speed of the substrate (head) is approximately 120 rpm, and the rotational speed of the polishing cloth (platen) is approximately 130 rpm when the polishing process is carried out. FIG. 3 shows the change in the level of protrusions 4 and non-protruding portions 5 relative to the upper surface of the semiconductor substrate 1 in the case where a first polishing process is carried out on a sample under the above described conditions for polishing, where the semiconductor element 2 has a thickness of approximately 180 nm and a P—SiO film having a thickness of approximately 1000 nm is formed in accordance with an HDP method as the interlayer insulating film 3. The level is measured through calculation using a method for optically measuring the thickness of the interlayer insulating film 3 using a spectroscopic ellipsometry method or a spectroscopic coherent light reflectance method, and a method for measuring the step on the surface of the interlayer insulating film 3 using an atomic force microscope method, and the average of the values measured for nine different points on the surface of a semiconductor substrate (wafer) having a diameter of approximately 200 mm is shown. Here, error bars for the points indicate inconsistency in the values measured for nine points within the surface, ranging from the upper limit to the lower limit.

Here, the surface of the interlayer insulating film 3 is actually in the above described first surface state at a stage where the first polishing process is carried out for ten seconds or more, and there are already no protrusions 4. In the following, however, how the level of the protrusions 4 which existed before the start of the first polishing process and the level of non-protruding portions 5 change when the first polishing process is carried out is explained, and for the sake of convenience, the region where there are protrusions 4 before the start of the first polishing process is referred to as "protrusions 4" and the region where there are non-protruding portions 5 before the start of the first polishing process is referred to as "non-protruding portions 5."

In FIG. 3, the black squares show the level of protrusions 4, and how they change is shown by the solid line 11. Meanwhile, the white circles show the level of non-protruding portions 5, and how they change is shown by the broken line 12. In addition, the up-down arrows beside the squares and circles show the inconsistency in the level among a number of samples when the first polishing process is carried out under the same conditions; and the solid arrows show the inconsistency in the level of the protrusions 4, and the dotted arrows show the inconsistency in the level of the non-protruding portions 5.

First, the difference in level between the protrusions 4 and the non-protruding portions 5 is approximately equal to the thickness of the semiconductor element 2 when the first polishing process is started (polishing time: 0 sec), and approximately 180 nm in the graph in FIG. 3.

Next, when the first polishing process is carried out for approximately ten seconds, the polishing process has more effect on the protrusions 4 in comparison with the non-protruding portions 5, and as a result, the top of the protrusions 4 comes closer to the top of the non-protruding portions 5. After that, the upper surface of the two regions barely changes, even when the first polishing process is carried out, after the top level of the protrusions 4 and the non-protruding portions 5 become approximately the same, and this suggests that polishing is not progressing. That is to say, the process can be considered as having shifted to the automatically stopping state, as described above, and flattening of the protrusions 4 is completed (that is to say, the state in FIG. 1C) and the surface of the interlayer insulating film 4 is in the above described first surface state.

Here, the polishing rate on the surface of the interlayer insulating film 3 is approximately 23 nm/min in the first surface state (after ten seconds of polishing time have elapsed), and this can be said to be a sufficiently slow polishing rate, in comparison with that for the protrusions 4 that are polished by approximately 180 nm over approximately 10 seconds after the start of the first polishing process.

As described above, the abrasive material used in the first polishing process is ceric oxide abrasive grains which have so-called non-Prestonian properties in which the polishing rate is slow when the polishing pressure is below a certain value. Thus, the process is such that there is no excessive polishing after the completion of flattening using these properties. Accordingly, it is preferable to make the polishing rate sufficiently great when there are protrusions 4 in comparison with the polishing rate after the completion of flattening of the surface with protrusions 4, in order for the properties to be used, and the first polishing process is carried out under such conditions, and thus, the surface can be flattened without excessively polishing the interlayer insulating film 3.

That is to say, the first polishing process is such that the polishing rate is high under a polishing pressure above a predetermined threshold value, and the polishing rate is sufficiently low under a polishing pressure below the threshold value, and therefore, it is necessary to adjust the conditions for polishing so that the polishing pressure on the surface of the film where there are protrusions 4 exceeds the above threshold value, while the polishing pressure on the surface of the film in the first surface state, where there are no protrusions 4, lowers the above threshold value, in order for the above described features to be sufficiently used. Concretely, the polishing rate on the surface of the interlayer insulating film 3 in the first surface state after the completion of the flattening process is 50 nm/min or less, but it is preferable for the polishing process to be carried out on the surface of the interlayer insulating film 3 at a polishing rate which is approximately four times higher when there are protrusions 4 before the flattening process is completed.

Incidentally, the polishing rate on the interlayer insulating film 3 after the completion of the flattening process on the protrusions 4 varies depending on the type of interlayer insulating film 3, which is the object to be polished, in addition to the material used for the abrasive grains. In the case of a P-TEOS film formed in accordance with a PE-CVD (plasma CVD) method, for example, the polishing rate after the flattening process is approximately 31 nm/min, which is higher than the polishing rate of 23 nm/min for the P—SiO film formed in accordance with the above described HDP method, but lower than 50 nm/min, and thus sufficiently low, and therefore, when such a material is used for the interlayer insulating film 3, the surface with protrusions 4 can be flattened without excessive polishing. Meanwhile, the polishing rate of the BPSG film formed in accordance with a thermal CVD method and doped with B and P is 450 nm/min or more after the flattening process, and therefore, the film cannot be said to be appropriate as an object to be polished in the first polishing process.

As described above, in the case where the polishing rate is sufficiently low after the completion of flattening of the surface with protrusions 4 in comparison with the polishing rate when there are protrusions 4, for example, it can be known when flattening is completed by continuously monitoring the change in the rotational torque of the substrate (head) or the rotational torque of the polishing cloth (platen), as is generally the case. Thus, the first polishing process is completed at the point in time when the completion of flattening is confirmed, and the surface with protrusions 4 can be flattened without excessive polishing.

However, the polishing rate in the first polishing process after the completion of flattening is sufficiently low, and therefore, as shown in FIG. 1C, defects 6, such as scratches caused during polishing, remain on the upper surface of the interlayer insulating film 3 after the completion of the first polishing process.

Here, a polishing process is carried out (hereinafter referred to as "second polishing process"; step #3) using an abrasive (hereinafter referred to as second abrasive) produced by mixing abrasive materials at a predetermined mixture ratio (hereinafter referred to as "second mixture ratio"), which is different from in the first polishing process in the step #2. Concretely, the second mixture ratio is such that the concentration of the polymer additive is equal to or less than $\frac{1}{2.5}$, preferably equal to or less than $\frac{1}{4}$, of in the first abrasive.

The non-Prestonian properties in the first polishing process are provided as a result of the polymer additive, and therefore, the level of the non-Prestonian properties can be changed by changing the composition ratio, using the same components. That is to say, the concentration of the polymer additive is lowered in the second abrasive in comparison with the first abrasive, and thus, the second polishing process can be carried out under such conditions that there are no non-Prestonian properties, and thus, it can be made more difficult for the second polishing process to shift to the automatically stopping state in comparison with the first polishing process. Here, the concentration of the polymer additive in the first abrasive may be higher than the first concentration (approximately 2.0 wt %), which is the lowest concentration for gaining non-Prestonian properties in regions other than the wafer edges, and the concentration of the polymer additive in the second polishing process may be lower than the above described first concentration. Here, it is preferable for non-Prestonian properties to be provided in regions where the polishing pressure is concentrated in the vicinity of the wafer edge during the first polishing process, and in order to do so, it is desirable for the concentration of the polymer additive in the first abrasive to be approximately four times higher than the above described first concentration. In this case, it is necessary for the concentration of the polymer additive in the second polishing process to be equal to or less than $\frac{1}{4}$ of the concentration of the polymer additive in the first abrasive.

In the step #3, a polishing process (second polishing process) is carried out using a second abrasive in which the concentration of polymer additive is low, and thus, a continuous polishing process can be carried out on the film after the first polishing process shifts to the automatically stopping state. That is to say, the second polishing process makes it possible to polish the upper surface of the interlayer insulating film 3, so that defects 6 remaining on the upper surface can be removed. With this second polishing process, it is not necessary to change the abrasive material and polishing cloth (platen) after the first polishing process, and thus, it is possible for the second polishing process to be carried out following the first polishing process. In this case, the polishing process can be continuously carried out in such a state that the second abrasive produced by mixing the same abrasive materials at the second mixture ratio is supplied to the polishing cloth after the first abrasive used in the first polishing process is removed from the polishing cloth.

The interlayer insulating film 3 is polished for approximately 40 seconds with an abrasive in which the concentration of polymer additive is equal to or less than 1/2.5, preferably equal to or less than 1/4, of in the first polishing process under a polishing pressure of approximately 3 psi, for example, and thus, approximately 100 nm of the film is removed. Table 1 below compares the number of defects on the surface of the interlayer insulating film 3 after polishing to the amount of interlayer insulating film 3 removed during the second polishing process.

TABLE 1

| Sample | Amount of film polished away in second polishing process [nm] | Number of defects (per wafer, >100 nm) |
| --- | --- | --- |
| S1 | 0 (only in first polishing process) | >30000 |
| S2 | 28 | 305 |
| S3 | 57 | 188 |
| S4 | 85 | 95 |
| S5 | 113 (only in second polishing process) | 53 |

The number of defects indicated in the above Table 1 is the number of defects having a size (average value of long sides and short sides of circumscribing rectangles of defect regions in a plane as viewed from top) equal to or more than approximately 100 nm per semiconductor substrate (wafer) having a diameter of approximately 200 mm after being appropriately washed. In the following, defects which can be counted are referred to as "defects 6."

The number of defects on the sample S1 was measured in the case where only the first polishing process, and not the second polishing process, was carried out. In addition, the number of defects on the samples S2 to S4 was measured in the case where the first polishing process was carried out under the same conditions, and the amount of film that was then polished away in the second polishing process varied from sample to sample. In addition, the number of defects on the sample S5 was measured in the case where the first polishing process was not carried out, and only the polishing process using a second abrasive produced by mixing abrasive materials at a second mixture ratio (second polishing process) was carried out. Here, the amount of film that is polished away during the second polishing process for the samples S2, S3, S4 and S5 were 28 nm, 57 nm, 85 and 113 nm, respectively.

It was found in the case of sample S1 that there were a great many defects 6 of which the number exceeded 30,000 on the surface of the interlayer insulating film 3 immediately after the first polishing process. Accordingly, in the case where the CMP process is completed only by carrying out the first polishing process, and the subsequent process is carried out, there is a concern that the many defects 6 remaining on the upper surface of the interlayer insulating film 3 may cause various problems, such as wires and via holes not being in a desired form, for example that there may be defects where the metal material that enters into the defects 6 when a metal film for wires is deposited is not normally etched during the etching process for forming a wire pattern, or defects where a portion of a pattern in a region above the defects 6 is missing or an unnecessary portion remains in the pattern after the photolithographic process.

Meanwhile, according to the results for the sample S2, 28 nm of the interlayer insulating film 3 was removed in the second polishing process, after the first polishing process, and thus, the number of defects was reduced to approximately 300 per wafer. As a result, though there were a large number of defects during the first polishing process, the majority were located at a depth of 30 nm or less in the interlayer insulating film 3 after the completion of the first polishing process, and thus, the defects 6 were efficiently removed when approximately 30 nm of the interlayer insulating film 3 were removed in the second polishing process. In addition, though the defects 6 caused during the first polishing process are naturally different depending on the state of the polishing apparatus, they are small in size in comparison with general abrasive grains, and it is difficult to prevent defects using only conventional methods for controlling the apparatus.

Further, according to the results for the sample S4, the number of defects could be reduced to approximately 100 or less per wafer when the amount of interlayer insulating film 3 that was removed in the second polishing process was increased to approximately 85 nm, and thus, the number of defects could be reduced to approximately the same as in the case where the CMP process was carried out using only the second polishing process, as with the sample S5.

Here, in the case where only the second polishing process was carried out, as with the sample S5, the number of defects could be reduced the most, as shown in the above Table 1. However, the conditions make it difficult for the second polishing process to shift to the automatically stopping state, in comparison with the first polishing process, and therefore, the polishing process progresses a great deal, even after the surface becomes of the first surface state, where there are no protrusions 4, and as a result, there is a risk that the polishing process may be excessive. That is to say, in the present embodiment, first a flattening process is carried out through the first polishing process, and thus, the surface of the film is converted to the first surface state while keeping the amount of film that is polished away minimal, and after that, the second polishing process is carried out, so that the minimum amount required for reducing the number of defects is removed, and thus, it becomes possible to reduce the number of defects remaining after the polishing process while at the same time keeping the amount of film that is polished away small.

Here, it can be understood from the results in the above Table 1 that it is desirable for the amount of interlayer insulating film 3 that is polished away to be approximately 30 nm or more, and 80 nm or more is more desirable.

Further, the second polishing process is carried out under such conditions that that it is more difficult for the polishing process to shift to the automatically stopping state in comparison with the first polishing process, and therefore, the polishing rate is high in comparison with in the first polishing process carried out on the interlayer insulating film 3 in the first surface state. Accordingly, it is easy to control how much of the interlayer insulating film 3 remains, by carrying out the second polishing process while monitoring the thickness of the interlayer insulating film 3 in accordance with a general optical means, and as a result, the CMP process can be completed with a desired amount of the interlayer insulating film 3. Accordingly, it becomes possible to prevent inconsistency in the process for forming the interlayer insulating film 3, as well as inconsistency in the polishing rate of the CMP apparatus.

After the completion of the second polishing process in the step #3, predetermined processes such as a wiring process, an interlayer insulating film depositing process and the like are carried out. As a result, the number of defects on the surface of the interlayer insulating film can be reduced, and at the same time, it is easy to control how much of the thickness of the interlayer insulating film 3 remains.

As described above, according to the present invention, the first polishing process carried out in order to flatten the surface of the film with protrusions, and the second polishing process carried out in order to reduce the number of defects on the surface, are carried out under different conditions for polishing, and thus, a flattening process can be carried out on the surface of the film to be polished without excessively polishing the film, and at the same time, the number of defects on the surface of the film after polishing can be greatly reduced in comparison with in the prior art. Furthermore, the second polishing process is carried out after the first polishing process, under such conditions that it cannot shift to the automatically stopping state as easily as the first polishing process, and therefore, the polishing rate thereof is higher than that of the first polishing process, and the surface of the film in the first surface state can be polished at a rate that can be monitored. As a result, it becomes possible to control the second polishing process so that it is completed at the point in time when a predetermined amount of film is polished away, and it is easy to control the amount of film that remains.

Next, the polishing apparatus which makes it possible to carry out the above described polishing process is described with reference to FIGS. 4A and 4B.

Figure 4A:
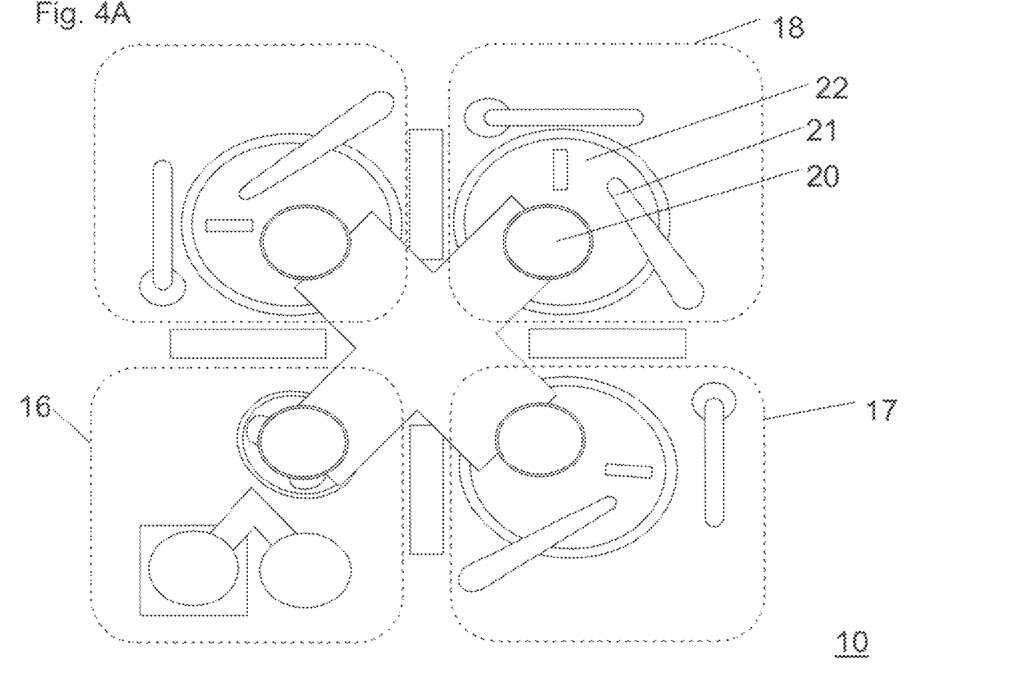
FIGS. 4A and 4B are schematic diagrams showing the structure of the polishing apparatus according to the present invention.
Figure 4B:
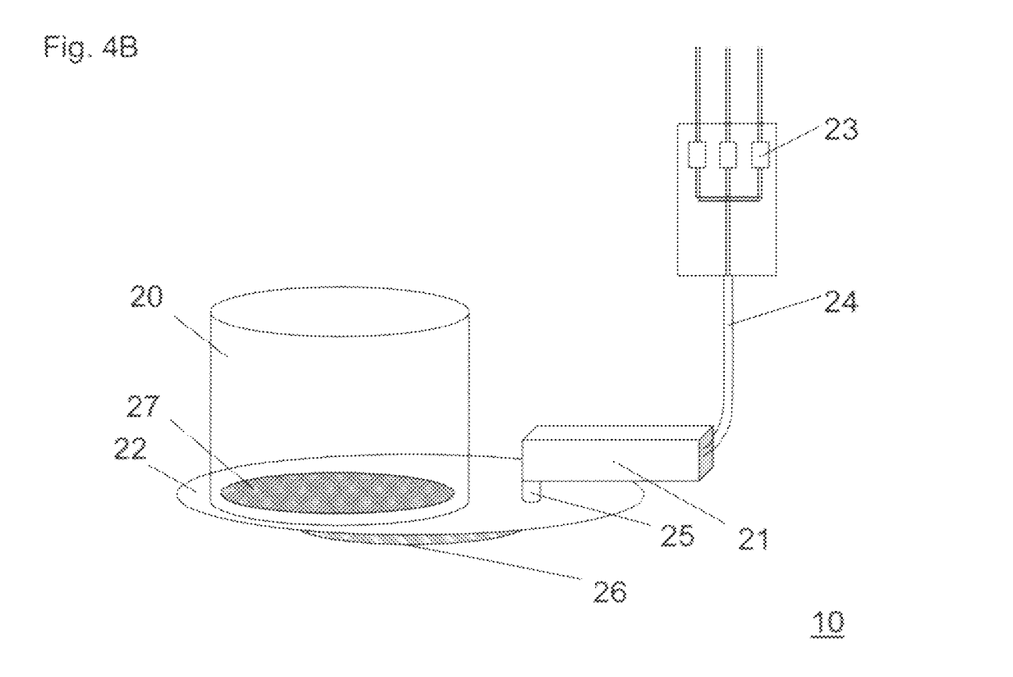

FIG. 4A is a schematic plan diagram showing the structure of the polishing apparatus according to the present invention as viewed from the top, and FIG. 4B is a front diagram.

A polishing apparatus 10 is provided with a wafer transferring unit 16, polishing stages 17 and 18, a substrate (head) 20, an abrasive supplying unit 21, a polishing cloth 22, a mixture ratio adjusting unit 23, an abrasive pipe 24, an abrasive supply port 25, and a polishing state detecting unit 26.

First, in the wafer transferring unit 16, a wafer 27 is placed on the substrate (head) 20 with the film to be polished (surface to be polished) facing the polishing cloth 22. Then, the wafer 27 is conveyed to the first polishing stage 17 (corresponding to the first polishing process unit) in such a state as to be held by the substrate (head) 20, in order to carry out the first polishing process (step #2).

On the first polishing stage 17, the mixture ratio is adjusted in the mixture ratio adjusting unit 23, so that the polishing materials, including abrasive grains, a polymer additive and water, are mixed at the above described first mixture ratio. Then, the first abrasive produced by mixing the materials at the first mixture ratio is fed to the abrasive supplying unit 21 via the abrasive pipe 24, and then supplied onto the polishing cloth 22 from the abrasive supply port 25.

Thus, when the first abrasive is supplied onto the polishing cloth 22, the substrate (head) 20 and the polishing cloth 22 are rotated, and pressure is applied to the substrate (head) 20, so that the first polishing process is carried out. When the polishing state detecting unit 26 detects that the polishing process has shifted to the automatically stopping state, the first polishing process is completed.

The polishing state detecting unit 26 continuously monitors the change in the rotational torque of the substrate (head) or the rotational torque of the polishing cloth (platen), for example, and when it detects that the torque has become of a predetermined relative value (for example 98% to 50%) or less of that immediately after the start of polishing, it determines that the polishing process on the film has shifted to the automatically stopping state. At this time, there are no protrusions or recesses of which the height or depth in the vertical direction is 100 nm or more on the surface of the polished film. Here, the above described predetermined relative value may be set to an appropriate value in accordance with the initial state of the surface of the film, for example the dimensions of the unevenness and the ratio of the area of the uneven portions to the area of the flat portions before polishing. In addition, as concerns the torque immediately after the start of polishing, the value measured in a state where the supply of the abrasive (first abrasive) from the abrasive supply port 25 and the rotation of the polishing cloth 22 and the wafer 27 have started can be used, for example.

When the polishing state detecting unit 26 detects that the first polishing process has shifted to the automatically stopping state, the polishing state detecting unit 26 sends out a signal indicating so to a control unit (not shown), and upon receiving this signal, the control unit sends out an instruction that the wafer 27 is to be conveyed to the second polishing stage 18 in such a state as to be held by the substrate (head) 20, in order to carry out a second polishing process on the film to be polished.

On the second polishing stage 18, the mixture ratio is adjusted in the mixture ratio adjusting unit 23, so that abrasive materials, including abrasive grains, a polymer additive and water, are mixed together at the second mixture ratio. Then, the second abrasive, which is produced by mixing the materials at the second mixture ratio, is fed to the abrasive supplying unit 21 via the abrasive pipe 24, and then supplied onto the polishing cloth 22 from the abrasive supply port 25.

Then, when the second abrasive is supplied onto the polishing cloth 22, the substrate (head) 20 and the polishing cloth 22 are rotated, as in the first polishing process, and pressure is applied to the substrate (head) 20, so that the second polishing process is carried out until a required amount is polished away, concretely, an amount of 30 nm or more is polished away (step #3).

After that, the wafer 27 is again conveyed to the wafer transferring unit 16, and then removed from the substrate (head) 20, and the surface of the wafer is washed in accordance with a known method in a washing installation, which is separate from the polishing installation.

Here, though in the polishing apparatus shown in FIGS. 4A and 4B, the first polishing process and the second polishing process are carried out on separate polishing stages, the polishing processes may be continuously carried out on the same polishing stage by changing the mixture ratio of the abrasive material by means of the mixture ratio adjusting unit 23 between the abrasive supplied onto the polishing cloth 22 in the first polishing process and that in the second polishing process. In this case, when the polishing state detecting unit 26 detects that the first polishing process has shifted to the automatically stopping state, a signal indicating so is sent from the polishing state detecting unit 26 to a control unit (not shown), and upon receiving this signal from the polishing state detecting unit 26, the control unit (not shown) sends out a control signal to the mixture ratio adjusting unit 23, so that the mixture ratio is changed from the first mixture ratio to the second mixture ratio. As a result, the second abrasive, which is produced by mixing the abrasive materials at the second mixture ratio, is supplied from the abrasive supply port 25 onto the polishing cloth 22, and thus, the process shifts to the second polishing process. At this time, the second abrasive which is produced by mixing the materials at the second mixture ratio may be supplied onto the polishing cloth 22 after the removal of the abrasive (first abrasive) from the polishing cloth 22, following the completion of the first polishing process.

Second Embodiment

The second embodiment of the present invention (hereinafter referred to as "the present embodiment") is described with reference to FIG. 5. The present embodiment is different from the first embodiment in that the second polishing process according to the step #3a is carried out instead of in the second polishing process according to the step #3, and the remaining is the same as that of the first embodiment. Described in the following are only points that are different from the first embodiment.

Figure 5:
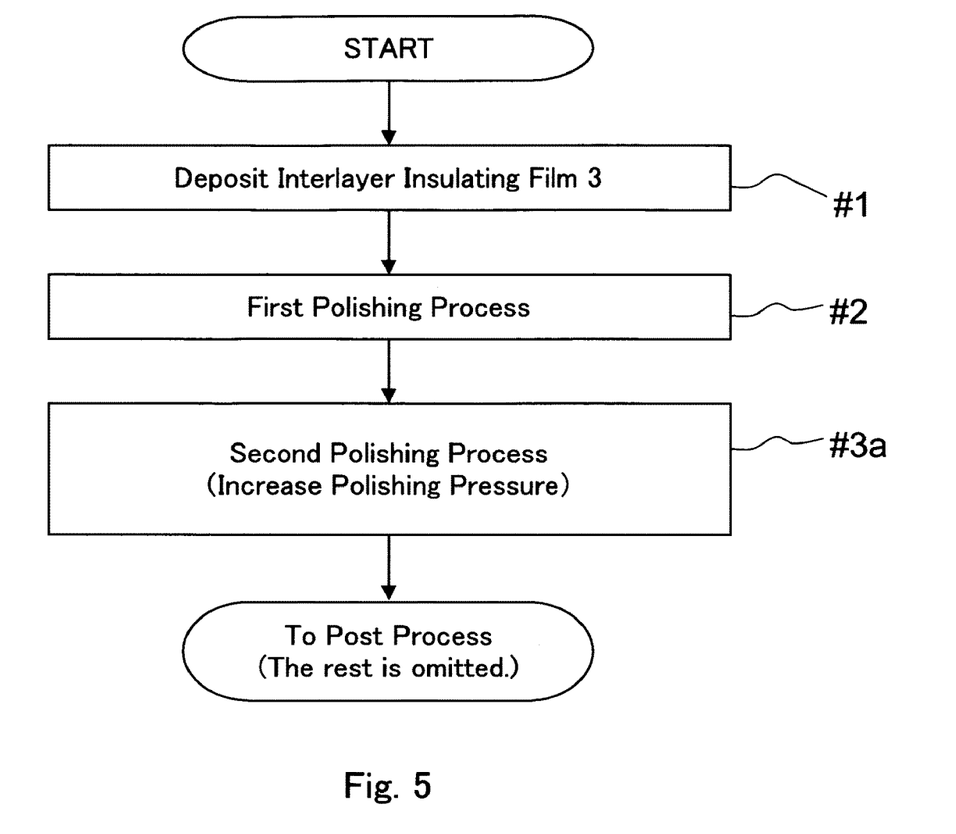
FIG. 5 is a flow chart showing the manufacturing steps in the method for manufacturing a semiconductor device according to the second embodiment of the present invention.

FIG. 5 is a flow chart showing the manufacturing steps in the present embodiment, and the respective steps in the following description are the steps in the flow chart shown in FIG. 5.

First, an interlayer insulating film 3 is deposited in the same manner as in the first embodiment (step #1), and after that, a first polishing process is carried out (step #2). Then, when the first polishing process shifts to the automatically stopping state, a second polishing process is carried out, by changing the polishing pressure (step #3a). Concretely, the polishing pressure is approximately 1.5 times higher than that of the first polishing process in the step #2, and another polishing process is carried out on the interlayer insulating film 3. In this second polishing process, the upper surface of the interlayer insulating film 3 is polished, and defects 6 remaining on the upper surface are removed. In the second polishing process, it is not necessary to change the abrasive and the polishing cloth (platen) used in the first polishing process, and thus, it is possible for the second polishing process to be carried out following the first polishing process. The interlayer insulating film 3 is polished for approximately 40 seconds under a polishing pressure of approximately 6 psi (approximately 41 kPa), so that approximately 100 nm of the film is removed, for example.

As for the conditions for the second polishing process at this time, it is desirable for the amount of interlayer insulating film 3 that is polished away in the second polishing process to be approximately 30 nm or more, as in the first embodiment, according to the above Table 1, and 80 nm or more is more desirable.

Thus, defects 6 are removed in the second polishing process, and after that, predetermined processes such as a wiring process, an interlayer insulating film depositing process and the like are carried out. As a result, the number of defects on the surface of the interlayer insulating film is reduced, and at the same time, it is easy to control how much of the interlayer insulating film 3 remains.

In the case of the method according to the present embodiment, the polishing pressure is greater in the second polishing process (step #3a) relative to that of the first polishing process (step #3), and therefore, the polishing rate is high in comparison with in the first polishing process carried out on the interlayer insulating film 3 in the first surface state. Accordingly, the second polishing process can be carried out while monitoring the thickness of the interlayer insulating film 3 by means of general optical technology, and thus, it is easy to control how much of the interlayer insulating film 3 remains, and as a result, the CMP process can be completed with the interlayer insulating film 3 having a desired thickness. Therefore, it becomes possible to prevent inconsistency in the process for forming the interlayer insulating film 3, as well as inconsistency in the polishing rate of the CMP apparatus.

In the first embodiment, only the mixture ratio of the abrasive materials is changed between the first polishing process and the second polishing process, and in addition, the polishing pressure may be changed, as in the second embodiment. Thus, the concentration of the polymer additive and the polishing pressure can both be changed, so that it is possible to flexibly control the conditions for the second polishing process, in order to adjust how much of the film remains while keeping the number of remaining defects as small as possible.

Further, though a case where a flattening process is carried out on an interlayer insulating film is given as an example for the above described embodiments, the film, which is an object to be polished, is not limited to an insulating film, and may be a conductive film. In addition, though the terms "protrusions" and "non-protruding portions" are used with reference to FIGS. 1A to 1D, these merely refer to uneven regions on the surface of the film, and it is possible to use the words "recesses" and "non-recess portions," with regions where the level is high as a reference. That is to say, the above described "first surface state," which is defined as a plane where there are no protrusions 4, is also a plane where there are no recesses, or, in brief, the state of the surface of a film having no regions where difference in level is within approximately 100 nm or more in the vertical direction, in the height or depth, relative to the surface of the semiconductor substrate 1.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A method for manufacturing a semiconductor device comprising:
   forming a film to be polished made of an insulating film or a conductive film on a semiconductor substrate; and
   flattening a surface of the film after the forming step, wherein the flattening step comprises a first polishing process carried out on the surface of the film using a first abrasive with non-Prestonian properties produced by mixing abrasive materials, including abrasive grains, a polymer additive and water, at a predetermined first mixture ratio, and
   a second polishing process carried out on the surface of the film using a second abrasive produced by mixing the abrasive materials at a predetermined second mixture ratio different from the first mixture ratio to make a concentration of the polymer additive lower than that of the first abrasive, wherein the second abrasive is produced so as to have the concentration of the polymer additive equal to or lower than ¼ of that of the first abrasive;
   wherein the second polishing process is carried out after the first polishing process shifts to an automatically stopping state in which polishing hardly progresses;
   wherein the first polishing process is carried out under a predetermined first polishing pressure and the second polishing process is carried out under a second polishing pressure higher than the first polishing pressure; and
   wherein the second polishing process is carried out on the surface of the film in a surface state which causes the first polishing process to shift to the automatically stopping state at a polishing rate equal to or more than 200 nm per minute.

2. The method for manufacturing a semiconductor device according to claim 1, wherein
   the second polishing process comprises removing a surface of the film by thickness of a region including at least part of defects generated in the film in the first polishing process.

3. The method for manufacturing a semiconductor device according to claim 1, wherein the second abrasive is produced so as to have the concentration of the polymer additive equal to ¼ of that of the first abrasive.

4. The method for manufacturing a semiconductor device according to claim 1 wherein the first polishing process is carried out using the first abrasive obtained by mixing the supplied abrasive materials at the first mixture ratio controlled by a polishing apparatus, and the second polishing process is carried out using the second abrasive obtained by mixing the supplied abrasive materials at the second mixture ratio controlled by the polishing apparatus.

5. The method for manufacturing a semiconductor device according to claim 1, wherein the second polishing process is completed when the film is polished by a thickness equal to or more than 30 nm.

6. The method for manufacturing a semiconductor device according to claim 1, wherein the film is a silicon oxide film formed in accordance with an HDP method.

7. The method for manufacturing a semiconductor device according to claim 1, wherein the second abrasive is produced so as to have the concentration of the polymer additive lower than ¼ of that of the first abrasive.

* * * * *